(12) United States Patent
Botrie

(10) Patent No.: US 6,670,545 B2
(45) Date of Patent: Dec. 30, 2003

(54) CONDUCTIVE COATING ON A NON-CONDUCTIVE FLEXIBLE SUBSTRATE

(75) Inventor: Alexander Botrie, Toronto (CA)

(73) Assignee: Chemque, Inc. (CA)

(*) Notice: Subject to any disclaimer, the term of this patent is extended or adjusted under 35 U.S.C. 154(b) by 0 days.

(21) Appl. No.: 09/421,559

(22) Filed: Oct. 20, 1999

(65) Prior Publication Data

US 2003/0010515 A1 Jan. 16, 2003

(51) Int. Cl.[7] .................................................. H05K 9/00
(52) U.S. Cl. .............................. 174/35 GC; 174/35 R
(58) Field of Search ..................... 174/35 GC, 35 R, 174/35 MS; 49/488

(56) References Cited

U.S. PATENT DOCUMENTS

| | | | |
|---|---|---|---|
| 4,652,695 A | | 3/1987 | Busby |
| 4,857,668 A | | 8/1989 | Buonanno |
| 4,931,479 A | | 6/1990 | Morgan |
| 4,968,854 A | | 11/1990 | Benn, Sr. et al. |
| 5,045,635 A | * | 9/1991 | Kaplo et al. ........... 174/35 GC |
| 5,061,566 A | | 10/1991 | Morgan |
| 5,141,770 A | | 8/1992 | Benn, Sr. et al. |
| 5,284,888 A | | 2/1994 | Morgan |
| 5,545,474 A | | 8/1996 | Podlaseck et al. |
| 6,075,205 A | * | 6/2000 | Zhang ................... 174/35 GC |

FOREIGN PATENT DOCUMENTS

| | | |
|---|---|---|
| DE | G 92 09 035.4 | 10/1992 |
| DE | 195 29 624 A1 | 2/1997 |
| EP | 0 368 612 | 5/1990 |
| WO | WO 93 23226 | 11/1993 |

OTHER PUBLICATIONS

Abstract of 00203651.5, 1 page.
European Search Report dated Aug. 30, 2002of EP 00 20 3651, 2 pages.

* cited by examiner

Primary Examiner—Jessica Han
(74) Attorney, Agent, or Firm—Banner & Witcoff, Ltd.

(57) ABSTRACT

Non-conductive, flexible, substrates having a conductive coating which are useful for EMI/RFI shielding applications. The conductive coating is compatible with the non-conductive substrate and provides continuous conductivity and complete EMI/RFI shielding.

22 Claims, 1 Drawing Sheet

CONDUCTIVE COATING ON A NON-CONDUCTIVE FLEXIBLE SUBSTRATE

FIELD OF THE INVENTION

This invention relates to non-conductive, flexible, substrates having a flexible, conductive coating and their use in gaskets, seals, and other articles.

BACKGROUND OF THE INVENTION

There is a need for gaskets, seals, and other products that can seal enclosure cabinets and other electrical and electronic housings to provide protection against moisture and dust. Such gaskets are placed in covers and between frames, panels, and doors of electronic equipment, cabinets, and housings. These gaskets must be soft and flexible with low compression deflection values. They must be capable of being compressed at least 50% for long periods of time without taking a compression set. They must also maintain their conductive and compression recovery properties after many compression-relaxation cycles.

These gaskets and seals must also provide an air and water tight seal. Products currently available are harder than is desirable resulting in the necessity of high closure forces being needed to produce an adequate seal. Because of this, parts to be sealed need to be thick and rigid to withstand these high closure forces.

Gaskets with low compression deflection values will permit cost and weight savings because thinner and lighter materials can be used for the part to be gasketed.

It is often necessary, particularly in electrical and electronic applications, that the gasket provide EMI/RFI shielding. Hence, typical gaskets are made with a conductive material in order to provide continuous conductivity and EMI/RFI shielding.

Conductive plastic-based products are particularly desirable for gaskets due to their good performance characteristics and ease of manufacture. However, due to the high concentration of conductive metals, the cost of such conductive plastics is high. This is especially true when a conductive metal such as silver is used.

Most conductive fillers are noble metals—metal coated with a metallic core or metal coated with a non-metal core. Most conductive fillers are hard and because the fillers must be used in high concentrations, the plastics tend to become hard, stiff and brittle compared to plastics that do not contain conductive materials. Currently available conductive gaskets are harder than non-conductive gaskets. It is also not possible to make them soft and flexible. They tend to be semi-flexible to rigid. Furthermore, conductive fillers tend to degrade the properties of the plastic matrix material in which they are incorporated. Therefore, the plastic binders need to be harder to hold the gasket or part together. This low binder concentration will cause the part to have poor physical properties.

A number of products have been developed to address the need for flexible, conductive gaskets. One product is a high frequency EMI/RFI shielding gasket made by wrapping a strip of knit mesh material or wire mesh around the exterior of a resilient core. Such a mesh-covered core is described in U.S. Pat. No. 4,652,695. The core can be made from any highly compressible material but is usually a flexible, non-conductive polyurethane or polyethylene foam. The wrap is tough and imparts good cut and abrasion resistance. The method of applying the wrap to the core is very efficient and less expensive than other available technology. Good shielding values are obtained, however, the wrap is stiff, causing high compression deflection values. The stiff wrap also makes it very difficult to bend the gasket. It is usually supplied in straight sections. Pieces have to be butted up against each other to form a continuous gasket. Other problems associated with this type of gasket are that the mesh itself usually contains large quantities of nickel or silver. This makes the wrap very expensive. It is not possible to make a waterproof seal. Water can leak in wherever the gasket sections are joined. Installation of these gaskets is very labor intensive causing the installation costs and therefore the final gasket costs to be high. Furthermore, even though the polyurethane foam may have good compression recovery, the wrap has very poor memory. This results in a gasket with poor compression recovery.

Until now, it has not been possible to apply a curable liquid conductive coating on a flexible substrate. There are a number of reasons for this. The polymeric binder and many of the conductive fillers used for EMI shielding are much harder than the desirable flexible substrates. Therefore, conductive coatings tended to be too hard. Flexing, elongating, or compressing the gasket resulted in cracks in the conductive coating. These cracks cause a deterioration of properties, including electrical conductivity. Many coatings that do not visually show signs of cracking will still lose conductivity on flexing or compressing. It is also difficult to bond to flexible substrates such as foams. If the conductive coating is not sufficiently flexible, applying it to a flexible substrate destroys the advantages of flexibility, softness and low compression deflection values.

There is a need for a soft, flexible, conductive coating without the disadvantages associated with the prior art.

SUMMARY OF THE INVENTION

This invention is directed to non-conductive substrates having conductive coatings. These coatings do not interfere with the good compression recovery of the substrate. Using this system, lower compression deflection values can be obtained which generate lower closing forces in gasket and seal applications.

The conductive coatings of this invention are easier to apply than other types of coatings. The coatings are soft and flexible, bond well to a variety of substrates, and are easily applied. In addition, the conductive coatings are less expensive than wrap and other available technology.

Products produced from conductive polymer coatings applied to flexible substrates retain their physical, mechanical and electrical properties under most usage conditions, such as repeated flexing, bending and stretching. Such products include gaskets. The finished gasket can be supplied on a continuous roll or it can be formed in place. Gaskets and seals can be made water and air tight.

The invention is directed to a non-conductive polymeric substrate having a conductive coating wherein at least one of the substrate and coating is a foam polymer and the other is a foam polymer or an elastomer, wherein the conductive coating has flexibility equal to or lower than the flexibility of the non-conductive substrate, and wherein the conductive coating comprises at least one conductive filler dispersed therein in an amount effective to provide EMI/RFI shielding.

DETAILED DESCRIPTION OF THE INVENTION

Figure 1:
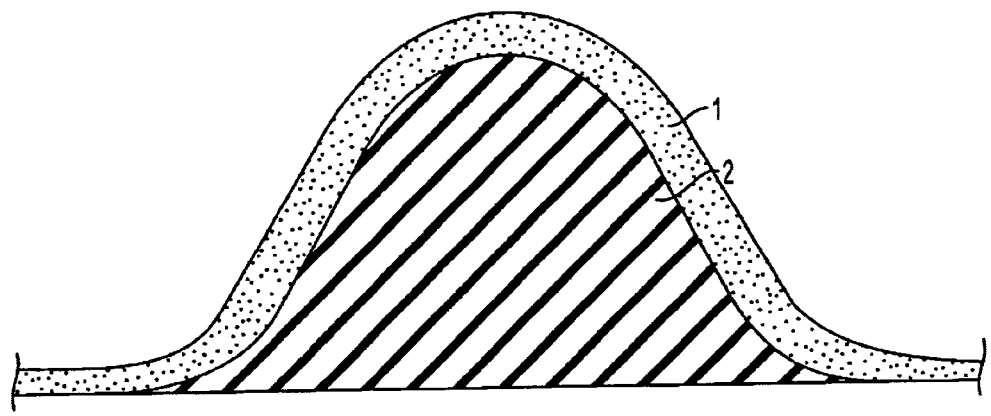
FIG. 1 depicts a coating on the top surface of a gasket.

The invention is directed to a non-conductive substrate having a conductive coating which is useful for EMI/RFI shielding applications. The conductive coating is compatible with the non-conductive substrate and provides continuous conductivity and essentially complete EMI/RFI shielding. The present invention is particularly directed to a flexible coating on a flexible substrate.

The conductive coating may be a thermoplastic or thermosetting polymer. The polymer can be a moisture cure system, a two-component system, a UV cure system, or a plastisol. Suitable polymers include polyurethane, silicone, polyester, epoxy, and acrylate based UV-cured polymers. The coating can be either a flexible elastomer or a flexible foam.

The coating can be foamed to minimize stress at the glue-line, decrease hardness, and increase flexibility and compressibility. Foams may be foamed either chemically or mechanically. Example of foams that are useful coatings can be found in U.S. Pat. No. 4,931,479, which is hereby incorporated by reference in its entirety.

At least one conductive filler is dispersed throughout the polymer in an amount effective to achieve EMI/RFI shielding, This is generally in the amount of from about 20 parts by weight to 80 parts by weight based on the weight of the polymer and preferably from about 40 parts by weight to about 70 parts by weight.

The one or more conductive fillers may be noble metals, base metals, noble metal coated non-noble metals, noble metal plated glass, noble metal plated plastics, noble metal plated ceramics and carbon blacks. Suitable conductive fillers include, but are not limited to silver, nickel, aluminum, copper, steel, and coatings of these on metallic and non-metallic substrates.

The conductive filler may be of any suitable form or shape such as particles, spheres, powders, flakes, and the like. If conductive particles are used, the size of the particles is typically between 1 micron and 80 microns, preferably, 10 microns and 30 microns, most preferably 20 microns diameter. However, it may be beneficial to use fillers other than particles.

Conductive coatings can lose their conductivity on repeated flexing and compressing. Thus, in accordance with a preferred embodiment, conductive fillers with high aspect ratios can be used which allow flexing of the coating without loss of conductivity in both foams and elastomers. Examples of such high aspect ratio fillers are flakes, fibers, filaments, needles, slivers and hollow microspheres. High aspect ratio fillers provide better particle to particle contact at lower load levels. This provides better conductivity at lower loading levels than is required when using fillers with low aspect ratios. The use of high aspect ratio fillers permits higher binder concentration. Furthermore, higher physical properties such as tensile strength, are obtainable with these fillers.

The diameter of high aspect fillers should be between about 0.1 micron and about 100 microns, preferably between about 15 and about 30 microns. The aspect ratio (L/D) is preferably between about 10/1 and 3000/1, more preferably between about 20/1 and 100/1. The concentration of the high aspect ratio fillers is between about 0.1% and about 60% by volume, preferably between about 10% and about 40%. See Table 1, items 2 and 6 and items 5 and 7.

Hollow microspheres also show good retention of conductive properties on flexible substrates. However, coatings using spherical fillers need to be thicker than conductive flakes and other high aspect ratio materials. Although not wishing to be limited by any theory, it is possible that the spherical fillers produce plastics that retain their conductivity on flexing because the spheres stack on top of each other. Spherical fillers with some compressibility give superior properties to those that are rigid. Spherical fillers produce gaskets and seals with lower physical properties than other high aspect ratio fillers.

Although the present invention may contain an elastomer substrate or coating, it is preferable that both the substrate and coating be a foam. Flexible foams offer several advantages over elastomers. The foams can be made much softer than elastomers while maintaining good physical properties. Softer materials make better gaskets and seals because they form a better seal against the mating surface. Foams can produce lower compression deflection values than elastomers. Foams have better compression recovery, and foams retain their conductive properties better under flexing and compression than elastomers do. See, Table 1, items 1 and 2, having a foam and elastomer of equal thickness.

A polyurethane or silicone elastomer has a minimum hardness of about Shore A 30 while maintaining good properties. Polyurethane and silicone foams can be made with hardness lower than Shore 00 10 while maintaining the desired properties. It is possible to produce foams with hardness of Shore 00 of zero or less.

It is important that the conductive coating be soft and flexible. It cannot crack or break during flexing or compressing. For use on flexible substrates, it is important that the coating has similar flexibility and compression deflection values as the non-conductive substrate. The flexibility must be similar to or more flexible than the substrate. If not, the conductive properties will deteriorate over repeated flexing and compression cycles. Soft coatings will also minimize the stress at the glue line, decreasing the chance of adhesive failure of the coating to the substrate. (See Table 1, items 1 and 3)

The coating must bond to the substrate. It should not delaminate on repeated bending and flexing. Failure must be cohesive that occurs within the substrate itself. Adhesion failure between the coating and the substrate is not acceptable. The flexibility of the coating should be equal to or more flexible than the flexibility of the substrate.

Foams of similar or more flexibility than the substrate provide better properties when they are thicker. Conductive properties are improved and stress at the glue line is decreased. The required thickness of a foam coating will depend on the thickness and flexibility of the substrate, the flexibility of the foam coating, and the conditions of use. Attention is drawn to Table 1, examples 7 and 8. The same foam coating was used, however in example 7, the coating thickness was 0.3 mm thick. In example 8, the coating thickness was 2.0 mm. The resistivity of the foam increased 40 times in example 7. Resistivity increased only five times in example 8. Therefore, a thicker foam coating will maintain its conductivity better than a thinner foam coating.

The thickness of a foam coating depends on the application. The thickness can vary from less than 0.1 mm or less to 6.0 mm or more. Typically the thickness is between about 0.1 mm and about 6.0 mm, preferably between about 0.1 mm and about 1 mm.

When elastomeric coatings are used, thin coatings perform better than thick coatings. Thin coatings have better flexibility and generate less stress where it is bonded to the substrate. Thin coatings also have better retention of conductive properties after repeated compression cycles. The same polyurethane elastomeric coating was used in examples 2 and 4. Example 2 is 0.3 mm thick and Example 4 is 1.0 mm thick. After flexing, the resistance of example 2 increased from 3.0 Ω/cm² to 25.0 Ω/cm²—an increase of 8 times. In example 4, resistance increased from 0.5 Ω/cm² to 2 KΩ/cm²—an increase of 4,000 times. Thin coatings retain their conductivity better than thick coatings. The size of the conductive filler particles is a significant factor on how thin the coating can be. Larger conductive fillers will force the coating to be thicker. Elastomeric coatings are typically between about 0.05 and about 0.5 mm, preferably, 0.1 to 0.5 mm, more preferably about 0.3 mm.

Lower density foams provide better retention of conductive properties than higher density foams. Lower density foams have a high ratio of air to elastomer. As the density of the foam increases it more closely resembles an elastomer. There is less air to cushion the cell walls when the foam compresses. This results in a decrease in conductivity. Attention is drawn to Table 1, examples 7 and 9. Both foams are of identical composition with the exception that example 7 has a foam density of 0.5 gm/cm³ and example 9 has a foam density of 1.5 gm/cm³. After flexing, the lower density foam in example 7 increased resistance 40 times whereas in example 9, the higher density foam increased 60 times. The lower density foam had better retention of its conductivity.

Softer, lower density fillers make softer, lower density foams and elastomers. Besides the cost considerations, it is advantageous to use softer, non-conductive fillers and coat them with a thin layer of the metallic conductive fillers. The resulting foams and elastomers will have better adhesion to the substrate and better flexibility. They will also produce a less expensive end product. The polymers used in elastomers and foams can only be made so soft before their physical properties start to deteriorate. These polymers are also present in much smaller quantities than the fillers. Therefore, many of the properties must be generated by using the correct fillers. The most suitable fillers will have a Moh hardness of less than 5 and preferably have a Moh hardness of less than 3. (See Table 1, items 9 and 13)

If necessary, catalysts, surfactants, and/or foam stabilizers may be added to the foams.

The substrate can be made from any polymeric flexible, compressible material. It can be a foam or an elastomer, thermosetting or thermoplastic. Some examples of materials suitable for the substrate are polyurethanes, silicones, plastisols, polyethylene, polyvinyl chloride, foams and elastomers.

The conductive coating of the present invention can be applied to a substrate that is already formed. The coating can also be simultaneously formed with the substrate. This can be referred to as a co-extrusion of the two materials. The materials in a co-extrusion process can be thermoplastic, thermosetting or a mixture thereof. No difference in conductivity was observed whether the coating was applied to the prefabricated substrate or when the coating and substrate were dispensed simultaneously.

The invention provides a very soft, flexible conductive coatings which will remain conductive after many cycles of flexing, bending, compressing or stretching. The conductive properties will not deteriorate.

Figure 2:
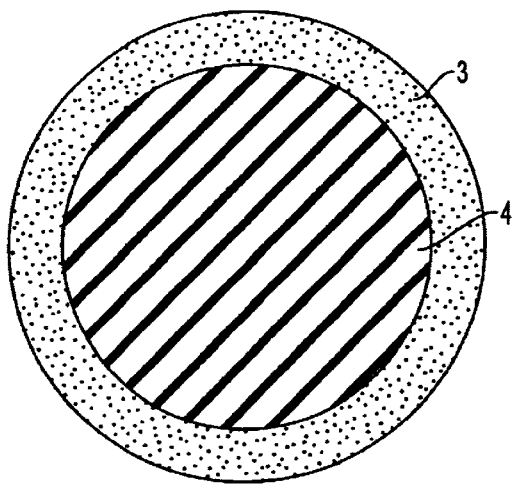
FIG. 2 depicts a coating encapsulating the gasket.

Attention is drawn to the figures. The coating (1) may be on the surface of the substrate (2) as depicted in FIG. 1 or the coating (3) may completely encapsulate the substrate (4) as depicted in FIG. 2.

Optionally, fibrous fillers such as conductive carbon and graphite fibers and filaments, metal coated carbon and graphite fibers and filaments and metal fibers and filaments may be incorporated into the coating. Such fillers will also help prevent the degradation of conductive properties on compressing, bending or flexing the coating.

Other fillers may be added to the conductive coating such as thermally conductive fillers, inert fillers, reinforcing fillers, pigments, microwave absorbing fillers and flame retardant fillers.

The flexible, conductive coatings of the invention can also be used on semi-flexible and rigid substrates to obtain better abrasion and scratch resistance. On rigid substrates they are particularly useful for improving contact with irregular surfaces. With semi-flexible and rigid substrates, it is not necessary to match the hardness as with flexible substrates.

It is preferred that the conductive foams and elastomers have a volume resistivity of from about 0.0017 ohms.cm to about 9.5 ohms.cm and a surface resistivity of from about 0.07 ohms/cm² to about 6.5 ohms/cm².

Table 1

Different substrates were coated with conductive coatings of different chemical backbones. The coatings also contain different types of conductive fillers. In all samples, the surface conductivity was measured. They were then compressed and released 500 times. They were compressed to 85% of their original height in the compression cycle. After 500 cycles, the conductivity was again measured. The results are reported in Table 1. The hardnesses roughly approximated the relative flexibilities of the coatings and substrates. This was confirmed using ASTM D747. Standard Test Method for Apparent Bending Modulus of Plastics by Means of a Cantilever Beam.

TABLE 1

| | Conductive Coating | Coating Hardness | Coating Thickness | Coating Density gm/cm³ | Non Conductive Substrate | Substrate Hardness | Substrate Thickness | Substrate Density gm/cm³ | Filler | Conductivity Before Ω/cm² | Conductivity After Ω/cm² |
|---|---|---|---|---|---|---|---|---|---|---|---|
| 1 | Polyurethane Foam | 20 - A | 0.3 mm | 0.5 | Polyurethane Foam | 20 - A | 10 mm | 0.25 | 20 mµ Ag Flake | 0.5 | 4.0 |
| 2 | Polyurethane Elastomer | 20 - A | 0.3 mm | 3.0 | Polyurethane Foam | 20 - A | 10 mm | 0.25 | 20 mµ Ag Flake | 3.0 | 25.0 |
| 3 | Polyurethane Elastomer | 20 - A | 0.3 mm | 3.0 | Polyurethane Foam | 40 - 00 | 10 mm | 0.25 | 20 mµ Ag Flake | 3.0 | >2 MΩ/cm² |
| 4 | Polyurethane Elastomer | 20 - A | 1.0 mm | 3.0 | Polyurethane Foam | 20 - A | 10 mm | 0.25 | 20 mµ Ag Flake | 0.5 | 2 KΩ/cm² |
| 5 | Polyurethane Foam | 40 - 00 | 0.3 mm | 0.5 | Polyurethane Foam | 40 - 00 | 10 mm | 0.25 | 10 mµ Ag Powder | 1.2 | 65.0 |

TABLE 1-continued

| | Conductive Coating | Coating Hardness | Coating Thickness | Coating Density gm/cm$^3$ | Non Conductive Substrate | Substrate Hardness | Substrate Thickness | Substrate Density gm/cm$^3$ | Filler | Conductivity Before Ω/cm$^2$ | Conductivity After Ω/cm$^2$ |
|---|---|---|---|---|---|---|---|---|---|---|---|
| 6 | Polyurethane Elastomer | 20 - A | 0.3 mm | 3.0 | Polyurethane Foam | 20 - A | 10 mm | 0.25 | 10 mμ Ag Powder | 5.0 | 2 KΩ/cm$^2$ |
| 7 | Polyurethane Foam | 40 - 00 | 0.3 mm | 0.5 | Polyurethane Foam | 40 - 00 | 10 mm | 0.25 | 20 mμ Ag Flake | 0.1 | 4.0 |
| 8 | Polyurethane Foam | 40 - 00 | 2.0 mm | 0.5 | Polyurethane Foam | 40 - 00 | 10 mm | 0.25 | 20 mμ Ag Flake | 0.05 | 0.25 |
| 9 | Polyurethane Foam | 40 - 00 | 0.3 mm | 1.5 | Polyurethane Foam | 40 - 00 | 10 mm | 0.25 | 20 mμ Ag Flake Moh Hardness 1 | 0.5 | 30.0 |
| 10 | MC Silicone Elastomer | 30 - A | 0.30 mm | 2.3 | Silicone Foam | 50 - A | 10 mm | 0.80 | Hollow Ag Coated Microspheres | 0.05 | 0.15 |
| 11 | Silicone Foam | 50 - A | 1.00 mm | 1.00 | Silicone Foam | 80 - A | 10 mm | 0.80 | 20 mμ Ag Flake | 2.8 | 5.9 |
| 12 | Polyurethane Foam | 10 - A | 1.0 mm | 2.9 | Polyurethane Foam | 40 - 00 | 10 mm | 0.30 | 10 mμ Ag Coated Ni Flakes | 3.0 | 7.0 |
| 13 | Polyurethane Foam | 20 - A | 1.0 mm | 1.5 | Polyurethane Foam | 40 - 00 | 10 mm | 0.25 | 20 mμ Ni Flakes Moh Hardness 5 | 5.0 | 3 KΩ/cm$^2$ |

It will be apparent to those skilled in the art that various modifications and variations can be made in the compositions and methods of the present invention without departing from the spirit or scope of the invention. Thus, it is intended that the present invention cover the modifications and variations of this invention provided they come within the scope of the appended claims and their equivalents.

What is claimed is:

1. A non-conductive polymeric substrate having a conductive coating bonded directly to the substrate wherein the substrate is a foam polymer or an elastomer and the conductive coating is a foam polymer, wherein the conductive coating has flexibility equal to the flexibility of, or is more flexible than, the non-conductive substrate, and wherein the conductive coating comprises at least one conductive filler dispersed therein in an amount effective to provide EMI/RFI shielding.

2. The substrate of claim 1 wherein the substrate has a hardness of between about Shore OO 0 and Shore A 80.

3. The substrate of claim 2 wherein the substrate has a hardness of between about Shore OO 0 and Shore OO 10.

4. The substrate of claim 2 wherein the substrate has a hardness of between about Shore A 30 and Shore A 80.

5. The substrate of claim 1 wherein the conductive coating has a volume resistivity of less than about 9.5 ohms.cm and a surface resistivity of less than about 6.5 ohms/cm$^2$.

6. The substrate of claim 1 wherein the substrate comprises a polyurethane or silicone foam.

7. The substrate of claim 1 wherein the conductive filler comprises particles.

8. The substrate of claim 7 wherein the filler has a particle size between about 1 micron and 80 microns in diameter.

9. The substrate of claim 8 wherein the filler has a diameter between about 15 and about 30 microns.

10. The substrate of claim 1 wherein the conductive filler comprises flakes, fibers, filaments, needles, slivers, or hollow microspheres.

11. The substrate of claim 10 wherein the conductive filler has a diameter between about 0.1 micron and about 100 microns, and an aspect ratio (L/D) between about 10/1 and 3000/1.

12. The substrate of claim 1 wherein the conductive filler is selected from the group consisting of noble metals, base metals, noble metal coated non-noble metals, noble metal plated glass, noble metal plated plastics, noble metal plated ceramics, carbon blacks, and mixtures thereof.

13. The substrate of claim 1 wherein the conductive filler is selected from the group consisting of silver, nickel, aluminum, copper, steel, and silver inorganic fillers.

14. The substrate of claim 1 wherein the conductive filler is incorporated into the polymer in an amount of from about 20 parts by weight to 80 parts by weight based on the weight of the polymer.

15. The substrate of claim 14 wherein the amount is from about 40 parts by weight to about 70 parts by weight.

16. The substrate of claim 1 wherein the thickness of the conductive coating is between about 0.1 mm and about 6.0 mm.

17. The substrate of claim 1 wherein the coating comprises a polyurethane or silicone foam.

18. The substrate of claim 1 wherein the substrate is a thermoplastic or thermosetting elastomer or foam.

19. The substrate of claim 1 wherein the substrate is preformed before application of the coating.

20. The substrate of claim 1 wherein the substrate and coating are coextruded.

21. A gasket comprising a non-conductive polymeric substrate having a conductive coating bonded directly to the substrate wherein the substrate is a foam polymer or an elastomer and the coating is a foam polymer, wherein the conductive coating has flexibility equal to the flexibility of, or is more flexible than, the non-conductive substrate, and wherein the conductive coating comprises at least one conductive filler dispersed therein in an amount effective to provide EMI/RFI shielding.

22. A seal comprising a non-conductive polymeric substrate having a conductive coating bonded directly to the substrate wherein of the substrate is a foam polymer or an elastomer and the coating is a foam polymer, wherein the conductive coating has a flexibility equal to the flexibility of, or is more flexible than, the non-conductive substrate, and wherein the conductive coating comprises at least one conductive filler dispersed therein in an amount effective to provide EMI/RFI shielding.

* * * * *